(12) United States Patent
Chang et al.

(10) Patent No.: US 12,527,200 B2
(45) Date of Patent: Jan. 13, 2026

(54) ORGANIC LIGHT EMITTING DISPLAY DEVICE

(71) Applicant: LG DISPLAY CO., LTD., Seoul (KR)

(72) Inventors: Su-Jin Chang, Paju-si (KR); Kyu-Hwan Lee, Paju-si (KR); Ji-Su Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 455 days.

(21) Appl. No.: 18/083,097

(22) Filed: Dec. 16, 2022

(65) Prior Publication Data

US 2023/0200183 A1 Jun. 22, 2023

(51) Int. Cl.
| | | |
|---|---|---|
| *H10K 59/50* | (2023.01) | |
| *G09G 3/3225* | (2016.01) | |
| *H10K 59/80* | (2023.01) | |
| *H10K 102/00* | (2023.01) | |

(52) U.S. Cl.
CPC .......... *H10K 59/50* (2023.02); *G09G 3/3225* (2013.01); *H10K 59/878* (2023.02); *H10K 59/8792* (2023.02); *G09G 2320/068* (2013.01); *H10K 2102/3031* (2023.02); *H10K 2102/351* (2023.02)

(58) Field of Classification Search
CPC .. H10K 59/50; H10K 59/878; H10K 59/8792; H10K 2102/351; H10K 2102/3031; G09G 3/3225; G09G 2320/068
See application file for complete search history.

(56) References Cited

U.S. PATENT DOCUMENTS

| | | | | |
|---|---|---|---|---|
| 11,175,700 B1 * | 11/2021 | Poole | ...... | G06F 1/1637 |
| 2018/0190942 A1 * | 7/2018 | Song | ...... | H10K 59/879 |
| 2018/0351133 A1 * | 12/2018 | Yoo | ...... | H10K 50/858 |

FOREIGN PATENT DOCUMENTS

| | | |
|---|---|---|
| JP | 2020-184479 A | 11/2020 |
| KR | 10-2018-0078142 A | 7/2018 |
| KR | 10-2018-0131714 A | 12/2018 |
| KR | 20190135778 A | 12/2019 |
| KR | 10-2020-0075597 A | 6/2020 |
| KR | 20200080611 A | 7/2020 |
| KR | 20210125480 A | 10/2021 |

OTHER PUBLICATIONS

Nguyen et al., CN 109473042, Mar. 15, 2019 (Year: 2019).*
Suzuki et al., WO 2020111101, Jun. 4, 2020 (Year: 2020).*
Huang, CN 113241354, Aug. 10, 2021 (Year: 2021).*
Office Action in Korean Appln. No. 10-2021-0181913, mailed on Oct. 15, 2025, 16 pages (with English translation).

* cited by examiner

*Primary Examiner* — Mary Ellen Bowman
(74) *Attorney, Agent, or Firm* — Fish & Richardson P.C.

(57) ABSTRACT

An organic light emitting display device includes a substrate including first to third sub-pixels; first to third light emitting diodes disposed on the substrate and respectively located in the first to third sub-pixels; and a transmittance control layer, light emitted from the first to third light emitting diodes being transmitted toward the transmittance control layer, the transmittance control layer including a lens-shaped transparent pattern and a gray pattern, wherein the gray pattern is located to cover the lens-shaped transparent pattern, and has different thicknesses according to a thick of the transparent pattern.

16 Claims, 7 Drawing Sheets

ORGANIC LIGHT EMITTING DISPLAY DEVICE

CROSS REFERENCE TO RELATED APPLICATIONS

The present application claims the priority of Korean Patent Application No. 10-2021-0181913 filed on Dec. 17, 2021, which is hereby incorporated by reference in its entirety for all purposes as if fully set forth herein.

BACKGROUND

Field of the Disclosure

The present disclosure relates to an organic light emitting display device having a limited viewing angle.

Discussion of the Related Art

Recently, as society enters a full-fledged information age, interest in information displays that process and display a large amount of information has been increased, and as a demand for using portable information media has been increased, various lightweight and thin flat displays have been developed and been in the spotlight.

In particular, among various flat display devices, an organic light emitting display device (OLED) is a self-luminous device and does not require a backlight used in a liquid crystal display device (LCD) which is non self-luminous device, and thus can be lightweight and thin.

Such the organic light emitting display device is widely used as display screens for various products which are not only portable electronic devices, such as mobile communication terminal, electronic notebook, e-book, PMP (Portable Multimedia Player), navigation, UMPC (Ultra Mobile PC), mobile phone, smart phone, tablet PC and watch phone, but also television, laptop, monitor and ATM as well.

Meanwhile, a general organic light emitting display device does not have a viewing angle limitation. However, recently, a viewing angle limitation is required for reasons of privacy protection and information protection.

For example, devices such as an ATM in financial institutions, a vehicle navigation, a laptop, and a tablet PC require a viewing angle to be limited in a left and right direction or an up and down direction to protect privacy.

In particular, in the case of a vehicle navigation, when an up and down viewing angle of the organic light emitting display device are wide, an image displayed on the organic light emitting display device may decrease a driver's concentration and interfere with driving. Furthermore, when driving at night, an image displayed on the organic light emitting display device may be reflected on a front windshield of the vehicle, which may adversely affect a driver's safe driving.

Therefore, recently, a structure in which a light control film is applied to limit a viewing angle has been proposed, but a cost of the film is high, which increases a manufacturing cost of the organic light emitting display device, and a thickness of the organic light emitting display device increases due to an addition of the film. Therefore, it is difficult to implement a lightweight and thin organic light emitting display device that has been recently demanded.

SUMMARY

Accordingly, the present disclosure is directed to an organic light emitting display device that substantially obviates one or more of the problems due to limitations and disadvantages of the related art.

More specifically, the present disclosure is to provide an organic light emitting display device having a limited viewing angle.

The present disclosure is also to provide an organic light emitting display device having a reduced cost and a simple structure.

Further, the present disclosure is to provide an organic light emitting display device which can adjust a viewing angle and prevent an image from being reflected on a front windshield of the vehicle and obstructing a driver's view when the organic light emitting display device is mounted on a vehicle.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting display device includes: a substrate including first to third sub-pixels; first to third light emitting diodes disposed on the substrate and respectively located in the first to third sub-pixels; and a transmittance control layer, light emitted from the first to third light emitting diodes being transmitted toward the transmittance control layer, the transmittance control layer including a lens-shaped transparent pattern and a gray pattern, wherein the gray pattern is located to cover the lens-shaped transparent pattern, and has different thicknesses according to a thickness of the transparent pattern.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Hereinafter, an aspect according to the present disclosure is described with reference to the drawings.

Figure 1:
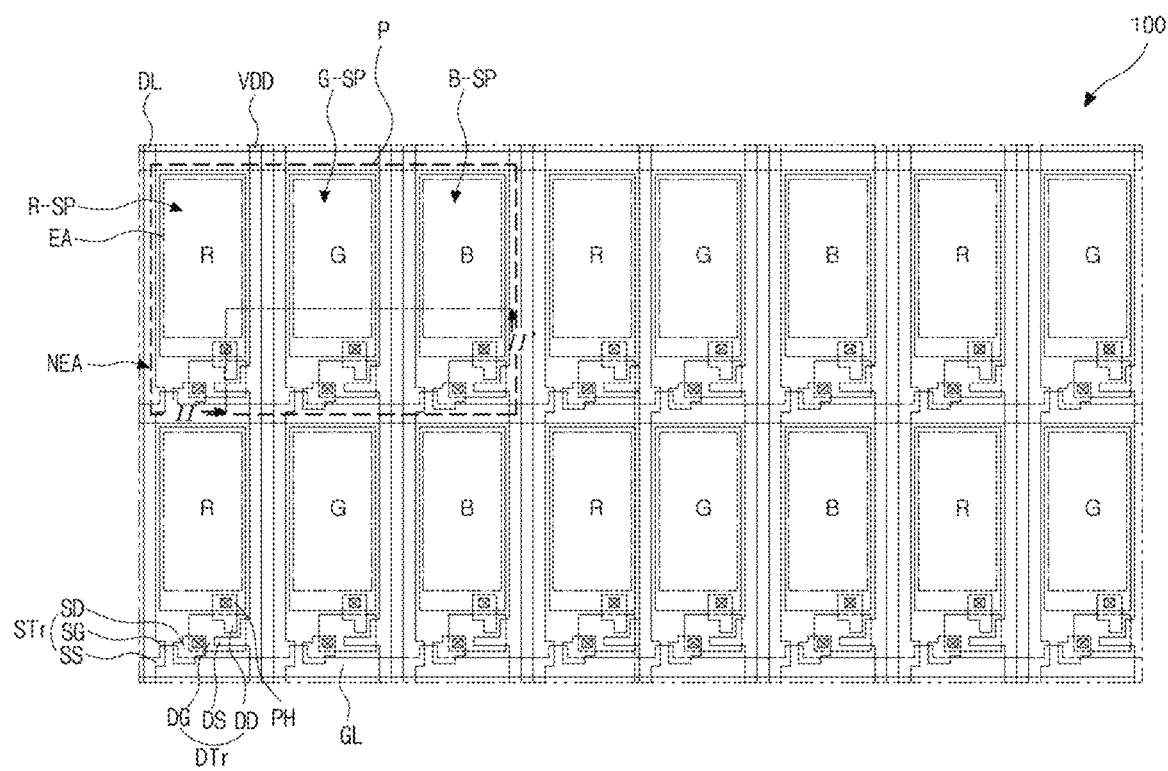
FIG. 1 is a plan view illustrating a plurality of sub-pixels in an organic light emitting display device according to an aspect of the present disclosure.
Figure 2:
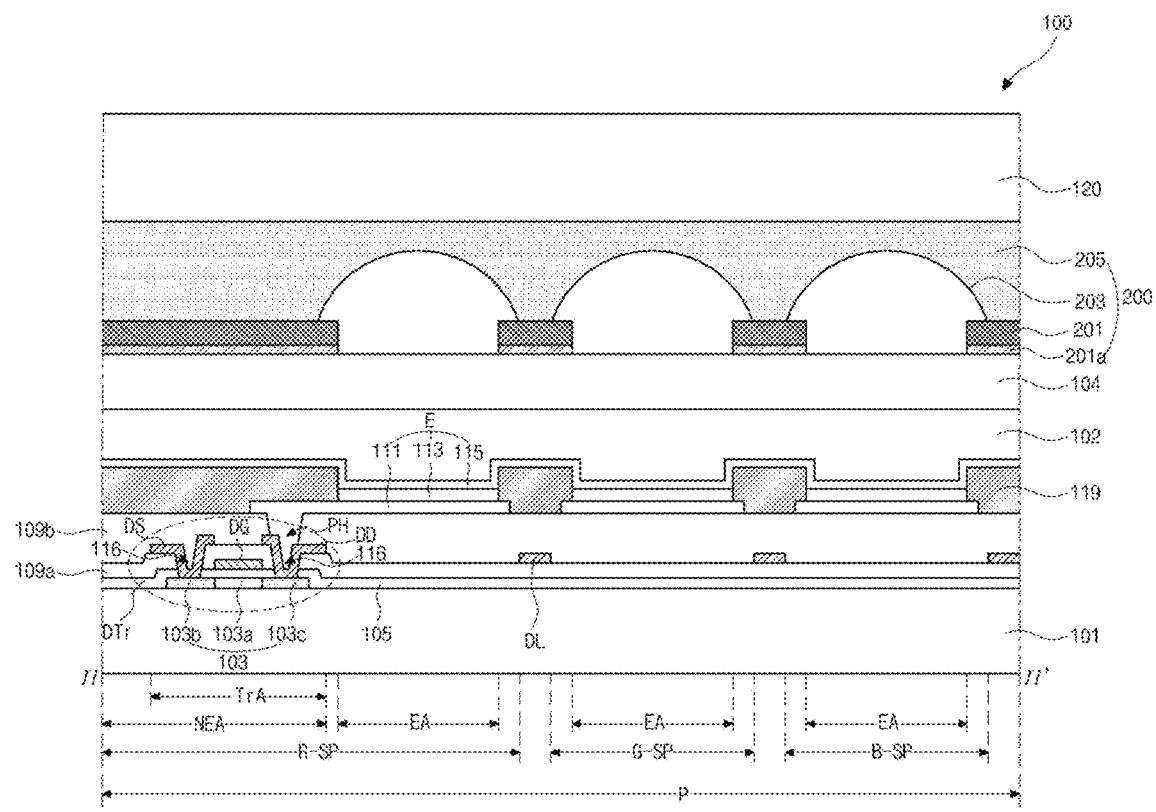
FIG. 2 is a cross-sectional view, taken along a line II-II' of FIG. 1, illustrating three a structure of a unit pixel including sub-pixels of an organic light emitting display device according to an aspect of the present disclosure.

FIG. 1 is a plan view illustrating a plurality of sub-pixels in an organic light emitting display device according to an aspect of the present disclosure. FIG. 2 is a cross-sectional view, taken along a line II-II' of FIG. 1, illustrating a structure of a unit pixel including three sub-pixels of an organic light emitting display device according to an aspect of the present disclosure.

As shown in FIGS. 1 and 2, in the organic light emitting display device 100 according to the first aspect of the present disclosure, one unit pixel P may include red, green and blue sub-pixels R-SP, G-SP and B-SP. Each of the sub-pixels R-SP, G-SP and B-SP may include an emission area EA, and a bank 119 may be disposed along an edge of the emission area EA to form a non-emission area NEA.

In this case, the red, green and blue sub-pixels R-SP, G-SP and B-SP may be alternately disposed in a horizontal direction, and each of a plurality of red, green and blue sub-pixels R-SP, G-SP and B-SP may be arranged in a vertical direction.

Here, for convenience of explanation, a structure in which each sub-pixel R-SP, G-SP or B-SP is arranged in a stripe form is illustrated. However, each sub-pixel R-SP, G-SP or B-SP may be formed of a polygon, but is not limited thereto, and each sub-pixel R-SP, G-SP or B-SP may have various shapes such as a circle, an ellipse, and a semi-ellipse.

In addition, the sub-pixels R-SP, G-SP and B-SP is illustrated as being positioned side by side with the same width, but the sub-pixels R-SP, G-SP and B-SP may have various structures with different widths.

At this time, switching and driving thin film transistors STr and DTr may be provided on the non-emission area NEA of each of the sub-pixel R-SP, G-SP and B-SP. A light emitting diode E including a first electrode 111, an organic light emitting layer 113 and a second electrode 115 may be disposed on the emission area EA of each of the sub-pixels R-SP, G-SP and B-SP.

Here, the switching thin film transistor STr and the driving thin film transistor DTr may be connected to each other, and the driving thin film transistor DTr may be connected to the light emitting diode E.

In more detail, a gate line GL, a data line DL and a power line VDD may be disposed on the substrate 101 to define each of the sub-pixels R-SP, G-SP and B-SP.

The switching and driving thin film transistors STr and DTr may be positioned on a switching area TrA of the non-emission area NEA of each of the sub-pixels R-SP, G-SP and B-SP. The switching thin film transistor STr may be formed in a region where the gate line GL and the data line DL cross each other, and the switching thin film transistor STr may serve to elect each of the sub-pixels R-SP, G-SP and B-SP.

The switching thin film transistor STr may include a gate electrode SG branching from the gate line GL, a semiconductor layer (not shown), a source electrode SS, and a drain electrode SD.

The driving thin film transistor DTr may serve to drive the light emitting diode E of each of the sub-pixels R-SP, G-SP and B-SP selected by the switching thin film transistor STr. The driving thin film transistor DTr may include a gate electrode DG connected to the drain electrode SD of the switching thin film transistor STr, a semiconductor layer 103, a source electrode DS connected to the power line VDD, and a drain electrode DD.

At this time, the semiconductor layer 103 may be made of silicon, and may include an active region 103a forming a channel at central portion thereof, and source and drain regions 103b and 103c doped with high concentrations of impurities at both side portions of the active region 103a.

A gate insulating layer 105 may be positioned between the semiconductor layer 103 and the gate electrode DG, and a first inter-layered insulating layer 109a may be positioned between the gate electrode DG and the source and drain electrodes DS and DD. In this case, the first inter-layered insulating layer 109a and the gate insulating layer 105 may include first and second semiconductor layer contact holes 116 exposing the source and drain regions 103b and 103c.

Accordingly, the source and drain electrodes DS and DD may contact the source and drain regions 103b and 103c of the semiconductor layer 103 through the first and second semiconductor layer contact holes 116, respectively.

A second inter-layered insulating layer 109b may be positioned on the source and drain electrodes DS and DD and the first inter-layered insulating layer 109a exposed between the source and drain electrodes DS and DD.

The first electrode 111 of the light emitting diode E may be positioned on the second inter-layered insulating layer 109b, and the first electrode 111 may be connected to the drain electrode DD of the driving thin film transistor DTr through a drain contact hole PH provided in the second inter-layered insulating layer 109b.

The first electrode 111 may be made of, for example, a material having a relatively high work function and form an anode of the light emitting diode E. The first electrode 111 may be located for each sub-pixel R-SP, G-SP or B-SP, and a bank 119 may be positioned between the first electrodes 111 of the sub-pixels R-SP, G-SP and B-SP.

The first electrodes 111 may have a separate structure for each of the sub-pixels R-SP, G-SP and B-SP with the bank 119 as a boundary for each of the sub-pixels R-SP, G-SP, and B-SP.

In addition, the organic light emitting layer 113 may be positioned on the first electrode 111. The organic light-emitting layer 113 may be configured with a single layer made of an emitting material. Alternatively, the organic light-emitting layer 113 may be configured with multiple layers of a hole injection layer, a hole transport layer, an emitting material layer, an electron transport layer and an electron injection layer to increase an emission efficiency.

The second electrode 115 forming a cathode may be positioned on the entire surface of the organic light emitting layer 113, and the second electrode 115 may be made of a material having a relatively small work function.

In the organic light emitting display device 100, when predetermined voltages are applied to the first electrode 111 and the second electrode 115 according to a selected signal, holes injected from the first electrode 111 and electrons injected from the second electrode 115 are transported to the organic light emitting layer 113 to form excitons, and when these excitons are transitioned from an excited state to a ground state, light is generated and emitted in a form of visible light.

Here, as the organic light emitting display device 100 according to the aspect of the present disclosure may be a top emission type, light emitted from the organic light emitting layer 113 may pass through the second electrode 115 and goes out, so that the organic light emitting display device 100 finally realizes an arbitrary image.

The top emission type display device can have the switching and driving thin film transistors STr and DTr widely provided under the bank 119 and the first electrode 111, and thus has an advantage in that a design area of the thin film transistors STr and DTr is wider than that of compared to the bottom emission type display device.

In this case, the first electrode 111 as the anode may be formed of a metal material having a high reflectance such as aluminum (Al) and silver (Ag), or be formed of a laminate structure of aluminum (Al), silver (Ag) and ITO. The second electrode 115 as the cathode may be formed of a transparent metal material such as ITO and IZO, or be formed of a semi-transmissive metal thin film using magnesium (Mg), silver (Ag), or magnesium (Mg) and silver (Ag) so that light emitted from the organic light emitting layer 113 can be transmitted.

A passivation layer 102 in a form of a thin film and an encapsulation substrate 104 may be sequentially positioned on the thin film transistors STr and DTr and the light emitting diode E. The passivation layer 102 may serve to prevent moisture penetration into each of the sub-pixels R-SP, G-SP and B-SP and to protect the organic light emitting layer 113 vulnerable to external moisture or oxygen.

In addition, the passivation layer 102 may serve to protect the thin film transistors STr and DTr and the light emitting diode E from external impact. Further, the passivation layer 102 may serve to couple the substrate 101 and the encapsulation substrate 104.

Accordingly, the organic light emitting display device 100 may be encapsulated. Here, in the organic light emitting display device 100 according to the aspect of the present disclosure, the organic light emitting layers 113 emitting different colors for the respective sub-pixels R-SP, G-SP, and B-SP may be formed.

That is, in the red sub-pixel R-SP, the organic light-emitting layer 113 emitting red light may be positioned in the entire emission area EA of the red sub-pixel R-SP. In the green sub-pixel G-SP, the organic light emitting layer 113 emitting green light may be positioned in the entire emission area EA of the green sub-pixel G-SP. In the blue sub-pixel B-SP, the organic light emitting layer 113 emitting blue light may be positioned in the entire emission area EA of the blue sub-pixel B-SP.

Therefore, the organic light emitting display device 100 according to the aspect of the present disclosure may emit lights of R, G, and B colors from the respective sub-pixels R-SP, G-SP and B-SP to realize full color with high luminance.

In particular, in the organic light emitting display device 100 according to the aspect of the present disclosure, a transmittance control layer 200 may be positioned to correspond to a transmission direction of light emitted from the organic light emitting layer 113.

The transmittance control layer 200 may include a black matrix 201 positioned to correspond to the non-emission area NEA of each of the sub-pixels R-SP, G-SP and B-SP, and a transparent pattern 203 positioned to correspond to the emission area EA of each of the sub-pixels R-SP, G-SP and B-SP, and may further include a gray pattern 205 covering the transparent pattern 203.

The black matrix 201 may block lights (L2 and L3 of FIG. 3) incident at an angle greater than or equal to a specific angle from the organic light emitting layer 113 with respect to a vertical plane of the organic light emitting display device 100. As such, in the organic light emitting display device 100 according to the aspect of the present disclosure, the viewing angle is limited.

In particular, the black matrix 201 according to the aspect of the present disclosure may further include a reflective layer 201a, so that light (L3 of FIG. 3) emitted from each of the sub-pixels R-SP, G-SP and B-SP is reflected and recycled and a light efficiency is further improved. This is described in more detail later.

In addition, the transparent pattern 203 of the transmittance control layer 200 may be formed in a semi-elliptical or semi-circular shape having a curved surface and be located to correspond to the emission area EA of each of the sub-pixels R-SP, G-SP, and B-SP. Due to the transparent pattern 203, a thickness (t1 and t2 of FIG. 3) of the gray pattern 205 of the transmittance control layer 200 may be formed differently for each region.

Accordingly, the organic light emitting display device 100 according to the aspect of the present disclosure can control transmittance of lights (L1, L2, L3 and L4 of FIG. 3) emitted from each of the sub-pixels R-SP, G-SP and B-SP. Thus, light (L1 of FIG. 3) incident at an angle less than or equal to a specific angle is transmitted, and lights (L2 and L4 of FIG. 3) incident at an angle greater than or equal to a specific angle is blocked from being output to an outside. Accordingly, an up and down viewing angle and/or a left and right viewing angle of the organic light emitting diode display 100 can be controlled to a narrow viewing angle.

A polarizing plate 120 for preventing a decrease in contrast caused by external light may be positioned on the transmittance control layer 200. That is, in the organic light emitting display device 100, the polarizing plate 120 blocking external light incident from an outside may be located in the transmission direction of light emitted from the organic light emitting layer 113 in a driving mode for realizing an image, thereby increasing the contrast.

Figure 3:
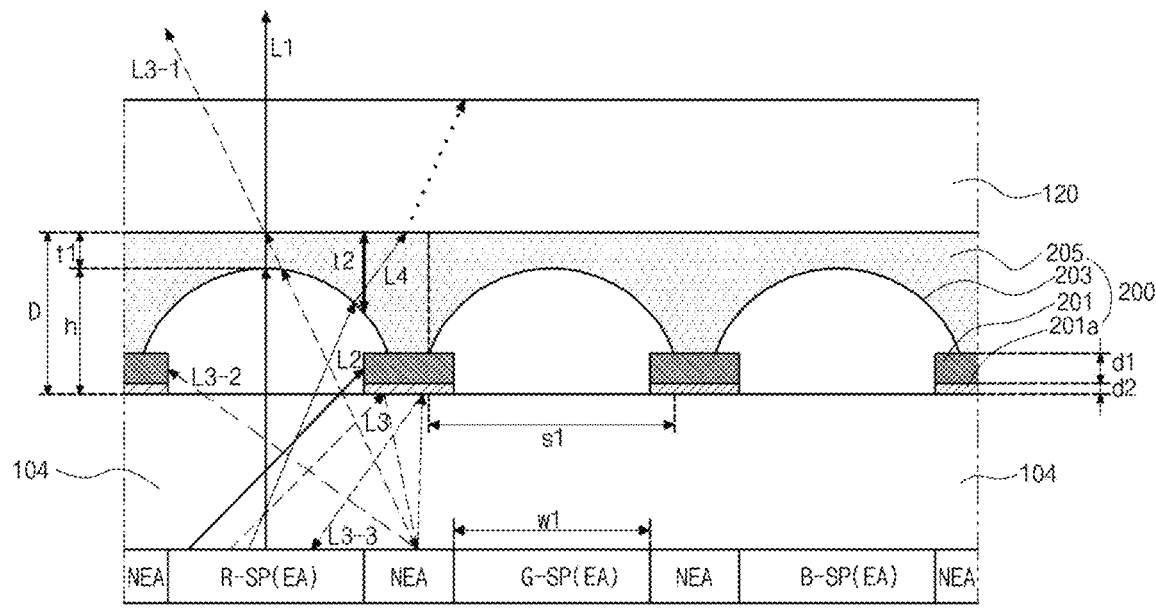
FIG. 3 is a view illustrating a light path of an organic light emitting display device according to an aspect of the present disclosure.
Figure 4A:
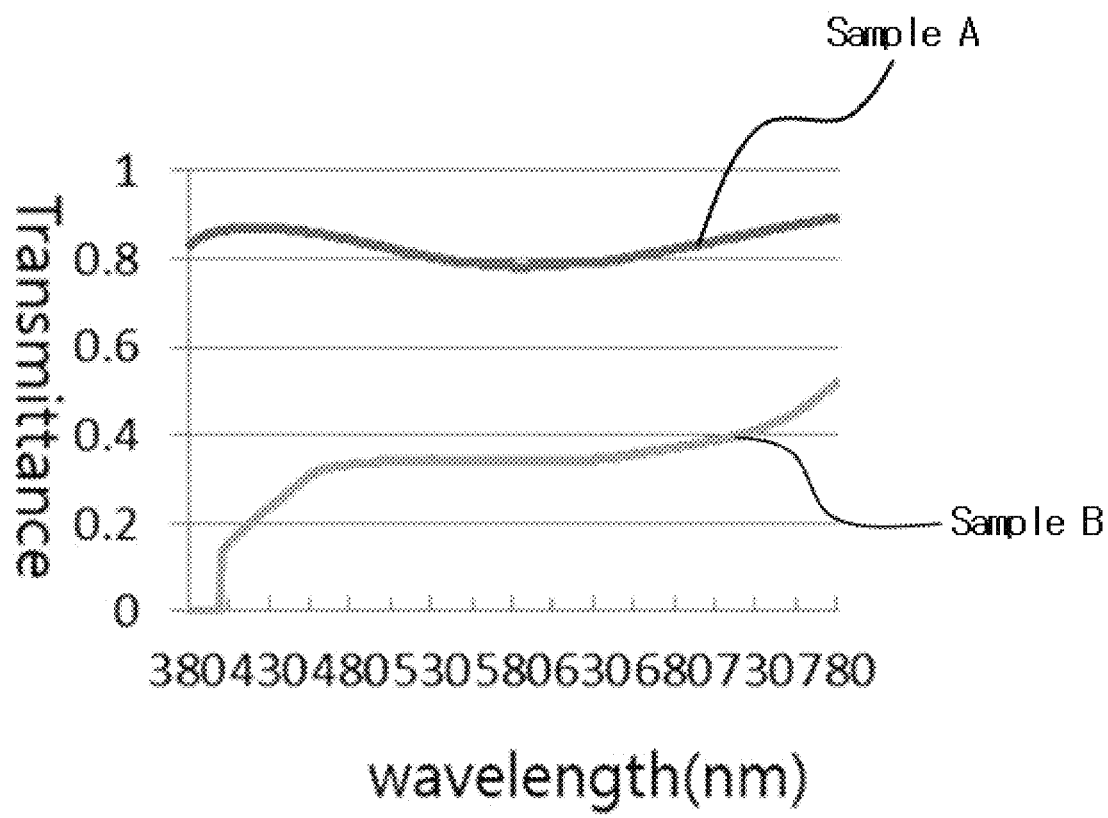
FIG. 4A is a graph showing a transmittance of light according to a wavelength of light.
Figure 4B:
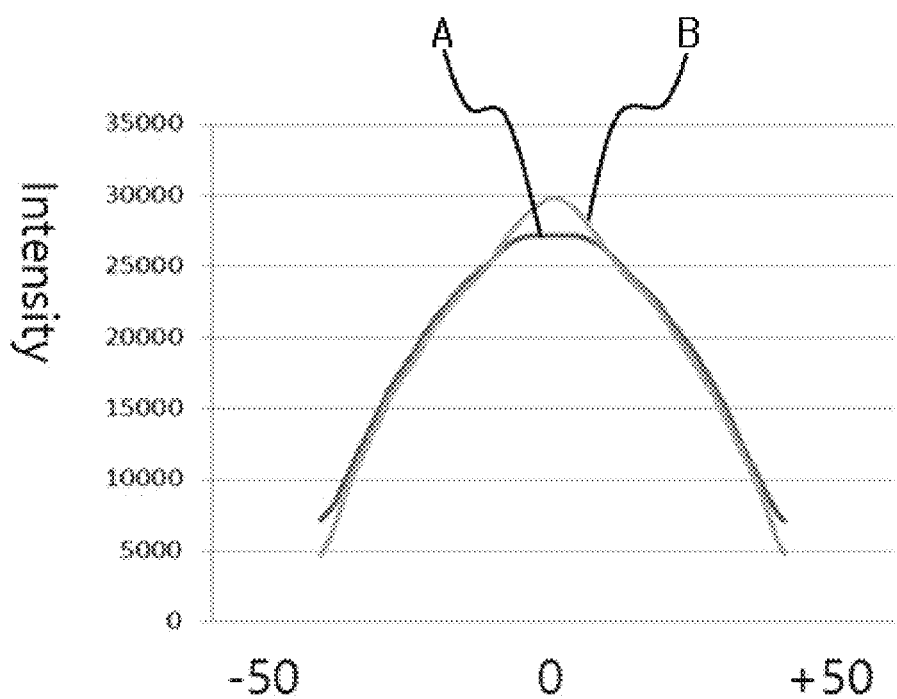
FIG. 4B is a graph of measuring a light efficiency by recycling according to a viewing angle.

FIG. 3 is a schematic view illustrating a light path of an organic light emitting display device according to an aspect of the present disclosure, and FIGS. 4A and 4B are graphs in which light efficiency by recycling is measured according to a viewing angle.

Figure 5A:
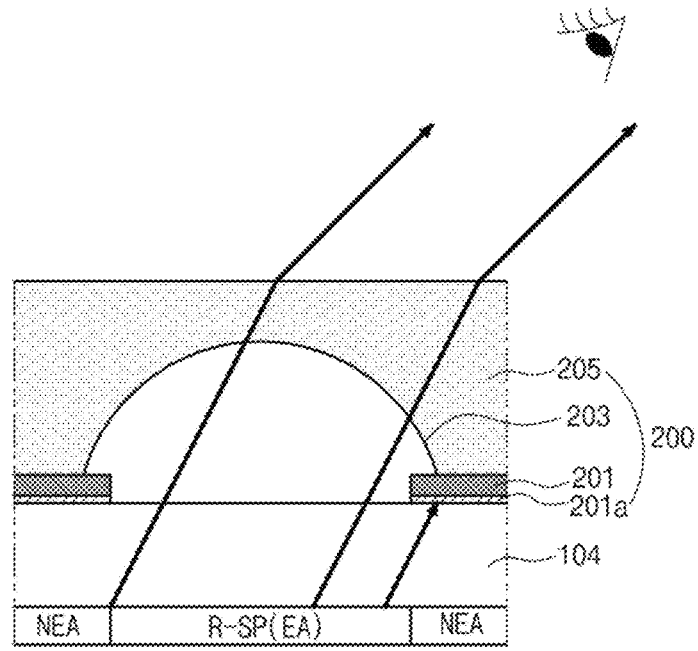
FIG. 5A is a cross-sectional view illustrating a vertical viewing angle of one sub-pixel of an organic light-emitting display device according to an aspect of the present disclosure.
Figure 5B:
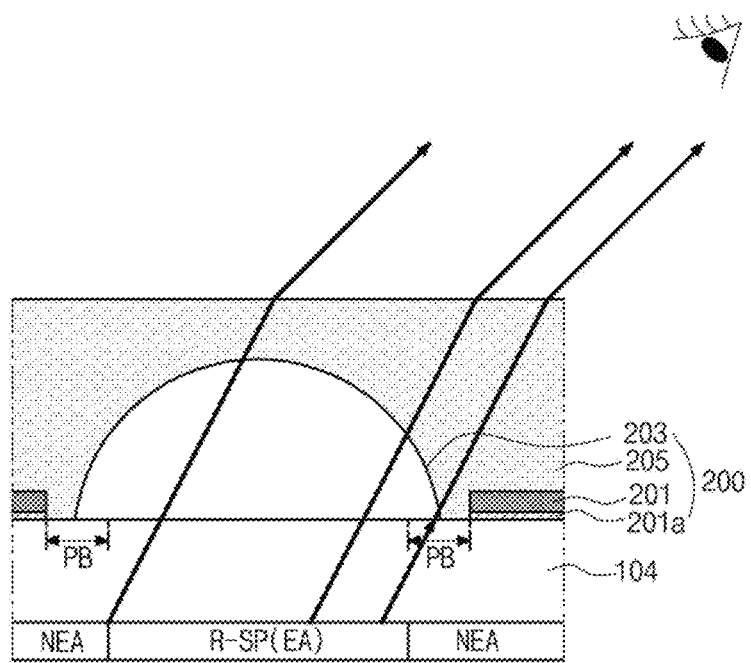
FIG. 5B is a cross-sectional view illustrating a horizontal viewing angle of one sub-pixel of an organic light-emitting display device according to an aspect of the present disclosure.

FIG. 5A is a cross-sectional view illustrating a vertical viewing angle of one sub-pixel of an organic light-emitting display device according to an aspect of the present disclosure, and FIG. 5B is a cross-sectional view illustrating a horizontal viewing angle of one sub-pixel of an organic light-emitting display device according to an aspect of the present disclosure.

As shown in FIG. 3, the transmittance control layer 200 may include the black matrix 201 positioned to correspond to the non-emission area NEA of each of the sub-pixels R-SP, G-SP and B-SP, and the transparent pattern 203 positioned to correspond to the emission area EA for each of the sub-pixels R-SP, G-SP and B-SP, and may further include the gray pattern 205 covering the transparent pattern 203.

Here, the transparent pattern 203 may have a lens shape of a semi-ellipse or semi-circle having a curved surface. A diameter s1 of the transparent pattern 203 having a curved surface may be larger than a width w1 of the emission area EA of each sub-pixel R-SP, G-SP or B-SP, thus the transparent pattern 203 may be disposed over the entire emission area EA, and thus all light emitted from the emission area EA may be accommodated in the transparent pattern 203.

That is, the transparent pattern 203 may be arranged such that it have a size larger than that of the emission area EA of each of the sub-pixels R-SP, G-SP and B-SP to cover all of the emission area EA and at least a portion of the non-emission area NEA.

Here, the width w1 of the emission area EA may mean the longest width within the emission area EA.

The transparent pattern 203 may be made of a binder resin, for example, at least one resin selected from a group consisting of polyester-based, acrylic-based, polyurethane-based, melamine-based, polyvinyl alcohol-based and oxazoline-based binder resins, and may be made of an acrylic-based binder resin.

The gray pattern 205 may be positioned to cover the transparent pattern 203 while filling a step formed by the transparent pattern 203 of a lens shape. The gray pattern 205 may be formed of a mixture of the transparent pattern 203 and gray dyes.

The transmittance of the transmittance control layer 200 can be adjusted according to the thicknesses t1 and t2 of the gray pattern 205.

That is, the gray pattern 205 may implement various transmittances according to the thicknesses t1 and t2. As the thicknesses t1 and t2 of the gray pattern 205 increase, the transmittance decreases.

Here, as the transparent pattern 203 has a lens shape, the gray pattern 205 corresponding to a vertex of the lens shape of the transparent pattern 203 has a first thickness t1, and the gray pattern 205 corresponding to a side surface of the lens shape of the transparent pattern 203 has a second thickness t2 that is greater than the first thickness t1.

The second thickness t2 of the gray pattern 205 may be substantially the greatest thickness on the side surface of the lens shape of the transparent pattern 203, and may be defined as a vertical thickness of the gray pattern 205 which is measured at a boundary between the emission area EA and the non-emission area NEA. Accordingly, a region corresponding to the first thickness t1 of the gray pattern 205 has an improved transmittance compared to a region corresponding to the second thickness t2. A total transmittance of the gray pattern 205 of the transmittance control layer 200 may be designed as a thickness per unit transmittance as shown below Equation 1.

$$\text{Total transmittance} = (-\text{Log transmittance}) \times \text{thickness.} \quad \text{Equation 1:}$$

That is, various transmittances can be realized by adjusting the thicknesses t1 and t2 of the gray pattern 205 of the transmittance control layer 200.

Through the Equation 1, the thicknesses t1 and t2 of the gray pattern 205 of the transmittance control layer 200 so as to have a desired transmittance at a specific region of each of the sub-pixels R-SP, G-SP and B-SP may be designed.

Here, in the organic light emitting display device (100 of FIG. 2) according to the aspect of the present disclosure, a height h of the transparent pattern 203 may be 5 μm to 8 and a thickness D of the gray pattern 205 is 6 μm to 15 μm. the thickness D of the gray pattern 205 may be increased by 20% to 30% compared to the height h of the transparent pattern 203.

Accordingly, in the organic light emitting display device (100 of FIG. 2) according to the aspect of the present disclosure, it may be designed that the gray pattern 205 having the first thickness t1 of the transmittance control layer 200 has a transmittance of 70% to 90% based on a 550 nm wavelength band, and the gray pattern 205 having the second thickness t2 has a transmittance of 40% to 60% based on a 550 nm wavelength band.

Alternatively, the gray pattern 205 having the first thickness t1 may be designed to have a transmittance of 80% or more, and the gray pattern 205 having the second thickness t2 may be designed to have a transmittance of 50% or less.

Therefore, when the lights L1, L2, and L4 emitted from the organic light emitting layer (113 of FIG. 2) of each of the sub-pixels R-SP, G-SP and B-SP pass through the second electrode (115 of FIG. 2) and are output to an outside, the first light L1 vertically emitted toward the front out of the lights L1, L2, and L4 is incident on the transparent pattern 203 of the transmittance control layer 200.

The first light L1 incident on the transparent pattern 203 passes through the transparent pattern 203 and then passes through the gray pattern 205 having the first thickness t1. At this time, when 100% of the light is incident on the gray pattern 205, 70% to 90% of the first light L1 passes through the gray pattern 205 having the first thickness t1 and is output to the outside.

Among the lights L1, L2, and L4 emitted from the organic light emitting layer (113 of FIG. 2), the second light L2 incident on the transmittance control layer 200 at an angle greater than or equal to a specific angle is blocked by the black matrix 201.

Here, a thickness d1 of the black matrix 201 may be designed according to the viewing angle. For example, the black matrix 201 may have a thickness d1 of several tens of nanometers to several tens of micrometers, but is not limited thereto. The black matrix 201 may have the thickness d1 which is capable of blocking the light L2 traveling at an angle of ±45 degrees or more up and down and/or left and right from the organic light emitting layer (113 of FIG. 2) with respect to the vertical plane of the organic light emitting display device (100 of FIG. 2).

The black matrix 201 may be positioned to correspond to the non-emission area NEA of each of the sub-pixels R-SP, G-SP and B-SP and may be formed in a form of a mesh. Thus, the organic light-emitting display device (100 of FIG. 2) can control the up and down viewing angle and the left and right viewing angle.

Therefore, the transmittance control layer 200 according to the aspect of the present disclosure can implement a narrow viewing angle.

In particular, the third light L3, which is a part of the second light L2, is reflected by the reflective layer 201a in the black matrix 201 and is incident into components of the organic light emitting display device (100 of FIG. 2) under the black matrix 201.

The third light L3 incident into the components of the organic light emitting display device (100 of FIG. 2) is reflected back by the components of the organic light emitting display device (100 of FIG. 2), and some light L3-1 is directed toward the front surface and passes through the transparent pattern 203 of the transmittance control layer 200 then is output to the outside, and some other light L3-2 is absorbed and removed by the black matrix 201, or some other light L3-3 is reflected again by the reflective layer 201a.

Accordingly, by allowing the third light L3 which travels at an angle greater than or equal to a specific angle toward the transmittance control layer 200 to be recycled through the reflective layer 201a, a light efficiency of the organic light emitting display device (100 of FIG. 2) can be improved.

The black matrix 201 may be made of a dark color pigment such as a black pigment or a gray pigment, a dark color dye such as a black dye or a gray dye, carbon black, or a light blocking material such as a photo resist. The reflective layer 201a made of a light reflective material of a metal such as (Al) or silver (Ag) may be positioned at a lower layer of the black matrix 201.

A thickness d2 of the reflective layer 201a may be less than the thickness d1 of the black matrix 201. In the case that the thickness d2 of the reflective layer 201a may be equal to or greater than the thickness d1 of the black matrix 201, the second light L2 incident at an angle greater than or equal to a specific angle among the lights L1, L2, and L4 may be reflected on the side surface of the reflective layer 201a and its path may be changed toward adjacent sub-pixels.

In this case, there is a problem in that light of an undesired color is emitted, and a color reproducibility is lowered.

In addition, among the lights L1, L2, and L4 emitted from the organic light emitting layer (113 of FIG. 2), the fourth light L4 incident on the transmittance control layer 200 at an angle greater than or equal to a specific angle passes through the transparent pattern 203 and then passes through the gray pattern 205 having the second thickness t2. At this time, 40% to 60% of the fourth light L4 is transmitted through the gray pattern 205 having the second thickness t2 to the outside.

Here, the fourth light L4 may have a smaller angle than the second light L2 with respect to the vertical plane of the organic light emitting display device (100 of FIG. 2). When the second light L2 travels at an angle of ±45 degrees or more up and down and/or left and right, the fourth light L4 may travel at an angle of ±30 degrees or more up and down and/or left and right with respect to the vertical plane.

At this time, the fourth light L4 passing through the gray pattern 205 having the second thickness t2 is output with a transmittance of 40% to 60%, and then passes through the polarizing plate 120 on the transmittance control layer 200. Thus, almost all of the fourth light L4 is extinguished while passing through the polarizing plate 120.

FIG. 4A is a graph showing a transmittance of light, in which a horizontal axis represents a wavelength of light, and a vertical axis represents a transmittance. Sample A represents a transmission amount of the light L4 that passes through the gray pattern 205 of the transmittance control layer 200, and sample B represents a transmission amount after the light L4 passes through the gray pattern 205 and then passes through the polarizing plate 120.

Referring to FIG. 4A, compared to an amount of the light L4 passing through the gray pattern 205 of the transmittance control layer 200, when the light L4 passes through the gray pattern 205 and then the polarizing plate 120, a transmission amount of the light L4 which passes through the gray pattern 205 and then the polarizing plate 120 significantly reduced.

Accordingly, when the fourth light L4 passing through the gray pattern 205 of the second thickness t2 and then the polarizing plate 120, the transmission amount is very low and almost all of the fourth light L4 is extinguished.

That is, in the organic light emitting display device (100 of FIG. 2) according to the aspect of the present disclosure, the viewing angle can be primarily controlled by the black matrix 201, and the viewing angle can be secondarily controlled through the gray pattern 205.

Accordingly, the organic light emitting display device (100 of FIG. 2) according to the aspect of the present disclosure has up and down and left and right viewing angles of ±30 degrees according to the control of the viewing angle of the transmittance control layer 200, thereby realizing a narrow viewing angle.

Here, among the lights L1, L2, and L4 emitted from the organic light emitting layer (113 of FIG. 2), the first light L1 vertically emitted toward the front surface also passes through the gray pattern 205 of the first thickness t1 on the transparent pattern 203, so that some light is absorbed by the gray pattern 205. At this time, a lost amount of the first light L1 is compensated by an amount of light recycled by the reflective layer 201a of the black matrix 201.

FIG. 4B is a graph of measuring a light efficiency by recycling according to a viewing angle, in which a horizontal axis represents a viewing angle and a vertical axis represents a light efficiency (i.e., intensity).

Prior to explanations, A is an experimental result of measuring a light efficiency of the organic light emitting layer (113 of FIG. 2) when only the black matrix 201 is provided, and B is an experimental result of measuring a light efficiency of the organic light emitting layer (113 of FIG. 2) when the black matrix 201 further includes the reflective layer 201a at a bottom thereof as in the aspect of the present disclosure.

Referring to FIG. 4B, it is seen that a light efficiency at a center of B is further increased. This is because a light efficiency of the organic light emitting display device (100 of FIG. 2) is improved by allowing the third light L3, which travels at a specific angle or more toward the transmittance control layer 200, to be recycled through the reflective layer 201a.

As described above, in the organic light emitting display device (100 of FIG. 2) according to the aspect of the present disclosure, the light efficiency is further improved by further including the reflective layer 201a under the black matrix 201, so that the loss of the first light L1, which is vertically emitted toward the front surface among the lights emitted from the organic light emitting layer (113 of FIG. 2), has been compensated for.

In summary, in the organic light emitting display device (100 of FIG. 2) according to the aspect of the present disclosure, the transmittance control layer 200 is formed at an outer side of the substrate 101 through which the lights L1, L2 and L4 are transmitted. Thus, the lights L2 and L4 incident at an angle greater than the angle are blocked, and thus the viewing angle is limited.

That is, as the organic light emitting display device (100 of FIG. 2) serves to display information desired by a user as an image, and it generally has a wide viewing angle so that the user can view the image from various angles. However, when the viewing angle is wide for each individual product to which the organic light emitting display device (100 of FIG. 2) is applied, product characteristics may be adversely affected, and in some cases, the user may request a narrow viewing angle.

As an example, in the case of an ATM of a bank, when a user inputs personal information, it is required to prevent other persons around from seeing personal information. Thus, the viewing angle of the organic light emitting display device (100 in FIG. 2) may be narrow.

As another example, in the case of a vehicle navigation, when the viewing angle of the organic light-emitting display device (100 of FIG. 2) is wide, an image displayed on the organic light-emitting display device (100 of FIG. 2) reduces the driver's concentration and interferes with driving. Moreover, when driving at night, an image displayed on the organic light emitting display device (100 of FIG. 2) is reflected from a front windshield of the vehicle, which may adversely affect a driver's safe driving.

As described above, although the organic light emitting display device (100 of FIG. 2) is generally manufactured to have a wide viewing angle, it is required to have a narrow viewing angle depending on the product to which the display device is applied.

Therefore, it is necessary to manufacture the organic light emitting display device (100 of FIG. 2) by adjusting a viewing angle to match the product to which the organic light emitting display device (100 of FIG. 2) is applied, but if the organic light emitting display device (100 in FIG. 2) is individually manufactured depending on the product, productivity is reduced.

As a result, a method for narrowing the viewing angle of the organic light emitting diode display device (100 of FIG. 2) manufactured to have a wide viewing angle is required. In the organic light emitting display device (100 of FIG. 2) according to the aspect of the present disclosure, the transmittance control layer 200 including the black matrix 201 and the gray pattern 205 are provided in the organic light emitting display device (100 of FIG. 2) having a wide viewing angle, so that the wide viewing angle of the organic light emitting display device (100 of FIG. 2) can be narrowed.

By further forming the transmittance control layer 200 provided with the black matrix 201 and the gray pattern 205 in the organic light emitting diode display device (100 in FIG. 2), the viewing angle can be narrowed.

Accordingly, the organic light emitting display device (100 of FIG. 2) according to the aspect of the present disclosure can protect privacy and does not need to add a separate film for limiting the viewing angle, so that lightweight and thinness of the organic light emitting display device (100 of FIG. 2) can also be implemented.

In particular, since the transmittance control layer 200 can be formed at a very low cost, a viewing angle can be limited at a low cost, and by simplifying a structure of the display device, an efficiency of a process can also be improved.

Meanwhile, when the organic light emitting display device (100 of FIG. 2) including the transmittance control layer 200 according to the aspect of the present disclosure is to be applied to a vehicle navigation, it is formed to have a narrow viewing angle in an up and down direction and to have a wide viewing angle in a left and right direction. As a result, a wide viewing angle is realized, so that an image displayed on the organic light emitting display device (100 of FIG. 2) can be provided to a passenger as well.

To this end, in the organic light emitting display device (100 of FIG. 2) according to the aspect of the present disclosure, as shown in FIG. 5A, in a vertical viewing angle, the black matrix 201 may be positioned to correspond to the non-emission areas NEA of the sub-pixels R-SP, G-SP and B-SP. Thus, the black matrix 201 may block the light L2 traveling at an angle of ±45 degrees or more up and down from the organic light emitting layer (113 of FIG. 2).

Meanwhile, as shown in FIG. 5B, in a horizontal viewing angle, the black matrix 201 may further include a pullback area PB.

The pullback area PB may be defined as a region correspond to a distance from an end of the bank 119, which defines the emission area EA of each sub-pixel R-SP, G-SP and B-SP, to an end of the black matrix 201 adjacent in an inside direction of the bank 119. Through the pullback area PB, the black matrix 201 may be designed so as not to affect a user's maximum horizontal viewing angle.

TABLE 1

| Pullback distance | Luminance decrease rate by viewing angle (45 degrees) |
|---|---|
| 0 um | 86%↓ |
| 1 um | 77%↓ |
| 3 um | 60%↓ |
| 6 um | 27%↓ |
| 9 um | — |

The above Table 1 shows an experimental result of measuring a luminance decrease rate by viewing angle according to a pullback distance, and the luminance decrease rate at a 45 degree viewing angle is measured. Looking at Table 1, it is seen that the luminance decrease rate varies according to the pullback area.

The pullback area PB may be determined by a cell gap defined as a distance from a upper (or top) surface of the organic light emitting layer (113 of FIG. 2) to a lower (or bottom) surface of the black matrix 201. Typically, in order not to affect the viewing angle of the light L4 traveling at an angle of 30 degrees among the lights L1, L2 and L4 emitted from the organic light emitting layer (113 of FIG. 2), the pullback area PB of about 4 μm to 5 μm is required. In addition, in order not to affect the viewing angle of the light L4 traveling at an angle of 45 degrees among the lights L1, L2 and L4 emitted from the organic light emitting layer (113 in FIG. 2), the pullback area PB of about 6 μm to 7 μm is required.

Therefore, in the organic light emitting display device (100 of FIG. 2) according to the aspect of the present disclosure, to maintain a narrow vertical viewing angle while maintaining a wide horizontal viewing angle, a size of the pullback area PB may be from 4 μm to 9 μm, including a process error of 1 μm to 2 in the horizontal direction with respect to the emission area EA.

Figure 6A:
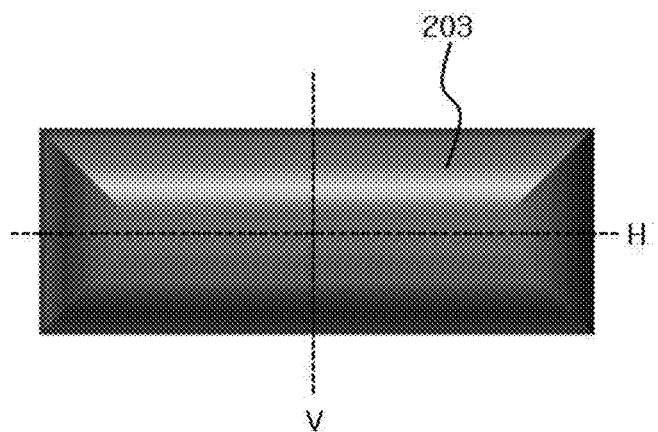
FIG. 6A is a front view illustrating a shape of a transparent pattern according to an aspect of the present disclosure.
Figure 6B:
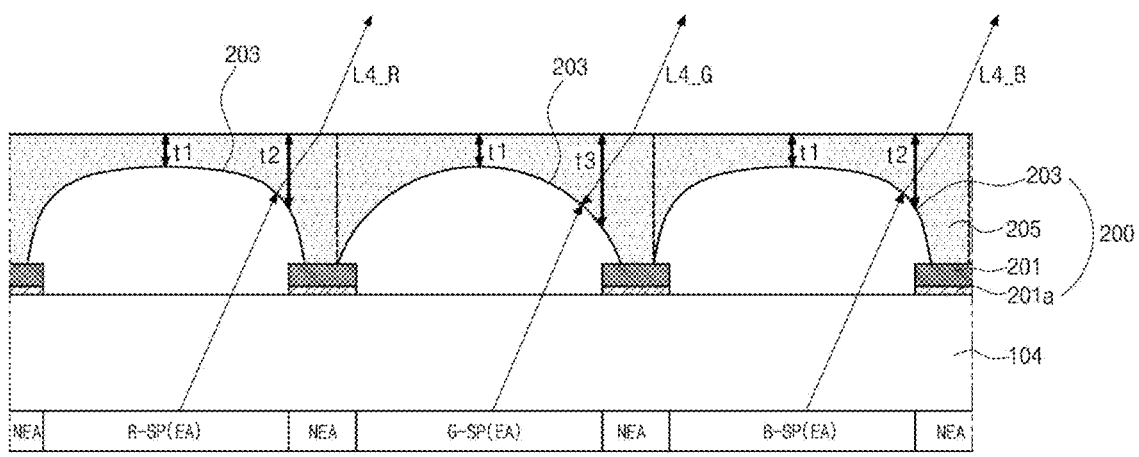
FIG. 6B is a cross-sectional view illustrating a structure of a unit pixel including three sub-pixels in a horizontal direction of a transparent lens in an organic light emitting display device according to an aspect of the present disclosure.

FIG. 6A is a front view illustrating a shape of a transparent pattern according to an aspect of the present disclosure, and FIG. 6B is a view illustrating a structure of a unit pixel including three sub-pixels in a horizontal direction of a transparent lens in an organic light emitting display device according to an aspect of the present disclosure.

Figure 7:
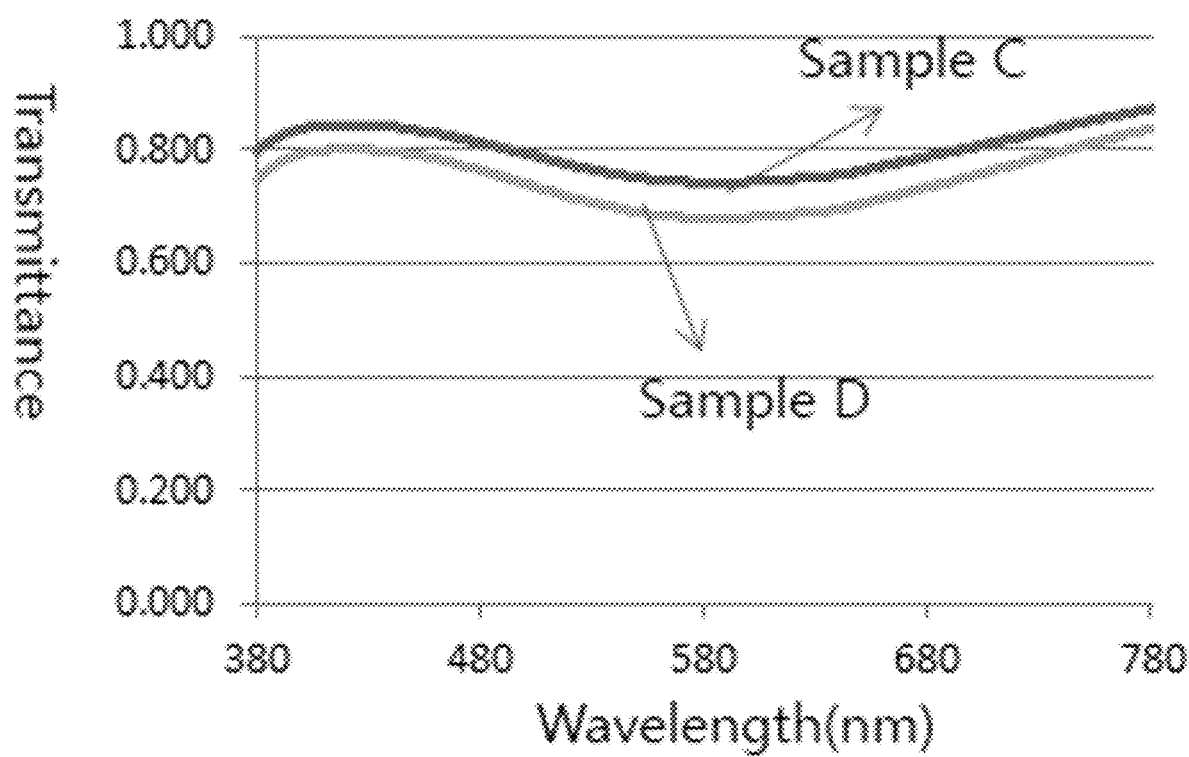
FIG. 7 is a graph illustrating a light transmittance in a horizontal direction for each sub-pixel.

FIG. 7 is a graph illustrating a light transmittance in a horizontal direction for each sub-pixel.

As shown in FIG. 6A, by including the pullback region (PB of FIG. 5B) in the black matrix 201 corresponding to the horizontal viewing angle, the transparent pattern 203 of the transmittance control layer 200 may be formed to be longer in the horizontal direction H than in the vertical direction V.

At this time, as shown in FIG. 6B, the transparent pattern 203 in the horizontal direction positioned to correspond to the green sub-pixel G-SP may be formed to have a shape of both curved surfaces based on a vertex different from those of the transparent patterns 203 in the horizontal direction positioned to correspond to the red and blue sub-pixel R-SP and B-SP. Accordingly, the second thickness t2 of the gray patterns 205 corresponding to the red and blue sub-pixels R-SP and B-SP may be different from the third thickens t3 corresponding to the green sub-pixel G-SP.

That is, the gray pattern 205 corresponding to the horizontal direction of the green sub-pixel G-SP may have the third thickness t3 which is thicker than the second thickness t2 of the gray patterns 205 corresponding to the horizontal direction of the red and blue sub-pixels R-SP and B-SP. Here, the gray pattern 205 having the second thickness t2 has a transmittance of 40% to 60%, so that the gray pattern 205 having the third thickness t3 may be designed to have a transmittance which is about 20% less than the transmittance of the gray pattern 205 having the second thickness t2. That is, the gray pattern 205 having the third thickness t3 may have a transmittance of 20% to 40% based on a wavelength band of 550 nm.

Accordingly, among the lights (L1, L2 and L4 of FIG. 3) emitted from the organic light emitting layer (113 of FIG. 2) of the green sub-pixel G-SP, the fourth green light L4_G incident to the transmittance control layer 200 at an angle greater than or equal to a specific angle is transmitted through the gray pattern 205 having the third thickness t3. At this time, 20% to 40% of the fourth green light L4_G passes through the gray pattern 205 having the third thickness t3 and is output to the outside.

Accordingly, the transmittance of the fourth green light L4_G is lower than those of the fourth red light L4_R and the fourth blue light L4_B which are incident to the transmittance control layer 200 at an angle greater than or equal to a specific angle among the lights (L1, L2 and L4 of FIG. 3) emitted from the organic light emitting layers (113 of FIG. 2) of the red and blue sub-pixels R-SP and B-SP.

FIG. 7 is a graph showing a transmittance of light in a horizontal viewing angle for each sub-pixel. In FIG. 7, a horizontal axis represents a wavelength of light and a vertical axis represents a transmittance.

Sample C represents transmittances of the fourth red light L4_R and the fourth blue light L4_B passing through the gray pattern 205 having the second thickness t2 of the transmittance control layer 200, and sample D represents a transmittance of the fourth green light L4_G passing through the gray pattern 205 having the third thickness t3 of the transmittance control layer 200.

Referring to FIG. 7, it is seen that the transmittance of the fourth green light L4_G passing through the gray pattern 205 having the third thickness t3 of the transmittance control layer 200 in sample D is lower than the transmittances of the fourth red light L4_R and the fourth blue light L4_B passing through the gray patterns 205 having the second thickness t2 of the transmittance control layer 200 in sample C.

Accordingly, it is seen that the transmittance of the fourth green light L4_G emitted from the organic light emitting layer (113 of FIG. 2) of the green sub-pixel G-SP is lower than the transmittances of the fourth red light L4_R and the fourth blue light L4_B emitted from the organic light emitting layer (113 of FIG. 2) of the red and blue sub-pixels R-SP and B-SP.

Accordingly, it is possible to prevent a greenish or yellowish phenomenon from occurring at a horizontal viewing angle.

That is, the red light L4_R and the blue light L4_B emitted from the red and blue sub-pixels R-SP and B-SP have a horizontal viewing angle that is narrower than that of the green light L4_G emitted from the green sub-pixel G-SP. Thus, a greenish or yellowish phenomenon, in which a white color becomes weak green and yellow toward an extreme viewing angle, appears. Such the color difference may be perceived by a user to cause poor visual perception, and may be recognized as a display defect.

In this regard, referring to Table 2 below, sample 1 represents a general organic light emitting display device, and sample 2 represents the organic light emitting display device (100 in FIG. 1) including the gray pattern 205 having the second thickness t2 for each of the sub-pixels R-SP, G-SP and B-SP, and sample 3 represents the organic light emitting display device (100 in FIG. 1) according to the aspect of the present disclosure which includes the red and blue sub-pixels R-SP and B-SP including the gray pattern 205 having the second thickness t2 and the green sub-pixel G-SP including the gray pattern 205 having the third thickness t3 in the horizontal direction.

TABLE 2

| Viewing angle | Red | | | Green | | | Blue | | |
| --- | --- | --- | --- | --- | --- | --- | --- | --- | --- |
| | Sample 1 Luminance | Sample 2 Luminance | Sample 3 Luminance | Sample 1 Luminance | Sample 2 Luminance | Sample 3 Luminance | Sample 1 Luminance | Sample 2 Luminance | Sample 3 Luminance |
| 0 degree | 100% | 100% | 100% | 100% | 100% | 100% | 100% | 100% | 100% |
| 30 degrees | 59% | 57% | 57% | 67% | 64% | 59% | 57% | 55% | 55% |

Looking at sample 1 and sample 2 of Table 2, the red light L4_R and the blue light L4_B emitted from the red and blue sub-pixels R-SP and B-SP have luminance of 59% and 57%, respectively, at a viewing angle of 30 degrees, but the green light L4_G emitted from the green sub-pixel G-SP has a luminance of 67% at the viewing angle of 30 degrees. Thus, at the viewing angle of 30 degrees, the red light L4_R and the blue light L4_B have lower luminance than the green light L4_G.

On the other hand, in sample 3, the green light L4_G has a luminance of 59%, which is reduced by about 5% compared to sample 2. Accordingly, the green light L4_G has a luminance similar to those of the red and blue lights L4_R and L4_B.

That is, by forming the gray pattern 205 having the third thickness t3 in the horizontal direction corresponding to the green sub-pixel G-SP, at a horizontal viewing angle, the luminance of the red light L4_R, green light L4_G and blue light L4_B emitted from the red, green, and blue sub-pixels R-SP, G-SP and B-SP can be made uniform at the horizontal viewing angle.

Therefore, an appearance of a greenish or yellowish phenomenon, in which a white color becomes weak green and yellow toward an extreme viewing angle, can be prevented. Thus, a color difference of a white display is minimized, and thus it is possible to implement the organic light emitting display device (100 of FIG. 1) in which a user's poor visual perception is prevented.

As described above, in the organic light emitting display device (100 in FIG. 1) according to the aspect of the present disclosure, the transmittance control layer 200 including the black matrix 201, the lens-shaped transparent pattern 203 and the gray pattern 205 covering the transparent pattern 203 is formed at the outer side of the substrate (104 of FIG. 6B) through which light is transmitted. Thus, the light (L2 of FIG. 3) incident at an angle greater than or equal to a specific angle is blocked, so that a narrow viewing angle can be implemented.

Accordingly, the organic light emitting display device (100 of FIG. 1) according to the aspect of the present disclosure can protect privacy and does not need to add a separate film for limiting the viewing angle, so that light-weight and thinness of the organic light emitting display device (100 of FIG. 1) can be implemented.

In addition, since the transmittance control layer 200 can be formed at a very low cost, a viewing angle can be limited at a low cost, and by simplifying a structure of the display device, an efficiency of a process can also be improved.

In addition, by allowing the light blocked by the black matrix 201 to be recycled, a light efficiency of the organic light emitting diode display device (100 of FIG. 1) can be improved. Further, by further including the pullback area (PB in FIG. 5B) in the black matrix 201, it is possible to maintain a narrow viewing angle at a vertical viewing angle while maintaining a wide horizontal viewing angle.

In addition, by positioning the gray pattern 205 having the third thickness t3 to correspond to the green sub-pixel G-SP, an appearance of a greenish or yellowish phenomenon at a horizontal viewing angle can be prevented.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light emitting display device, comprising:
    a substrate including first to third sub-pixels;
    first to third light emitting diodes disposed on the substrate and respectively located in the first to third sub-pixels; and
    a transmittance control layer, light emitted from the first to third light emitting diodes being transmitted toward the transmittance control layer, the transmittance control layer including a lens-shaped transparent pattern and a gray pattern,
    wherein the gray pattern is located to cover the lens-shaped transparent pattern, and has different thicknesses according to a thickness of the lens-shaped transparent pattern, and
    wherein the transparent pattern has a horizontal shape corresponding to a green sub-pixel among the first to third sub-pixels that is different from a horizontal shape of the transparent pattern corresponding to red and blue sub-pixels among the first to third sub-pixels.

2. The organic light emitting display device of claim 1, wherein the lens-shaped transparent pattern is located to correspond to an emission area of each of the first to third sub-pixels, and
    wherein a diameter of the transparent pattern is larger than a width of the emission area.

3. The organic light emitting display device of claim 1, wherein a transmittance of the gray pattern having a first thickness corresponding to a vertex of the transparent pattern is larger than a transmittance of the gray pattern having a second thickness thicker than the first thickness and corresponding to a side surface of the transparent pattern.

4. The organic light emitting display device of claim 3, wherein the gray pattern having the first thickness has a transmittance of 70 to 90%, and
    wherein the gray pattern having the second thickness has a transmittance of 40 to 60%.

5. The organic light emitting display device of claim 1, wherein the gray pattern has a thickness 20% to 30% greater than a height of the transparent pattern.

6. The organic light emitting display device of claim 1, wherein the gray pattern corresponding to the red and blue sub-pixels has a third thickness corresponding to a side surface of the transparent pattern in the horizontal direction, and
    wherein the gray pattern positioned corresponding to the green sub-pixel has a fourth thickness, greater than the third thickness, corresponding to a side surface of the transparent pattern in the horizontal direction.

7. The organic light emitting display device of claim 6, wherein the gray pattern having the fourth thickness has a transmittance of 20 to 40%.

8. The organic light emitting display device of claim 2, wherein the transmittance control layer further includes a black matrix corresponding to a non-emission area surrounding an edge of the emission area of each of the first to third sub-pixels, and
    wherein a reflective layer is provided under the black matrix.

9. The organic light emitting display device of claim 8, wherein the black matrix includes a pullback area exposing a portion of the non-emission area corresponding to a horizontal viewing angle.

10. The organic light emitting display device of claim 9, wherein the pullback area has a width of 4 μm to 9 μm in a horizontal direction with respect to the emission area.

11. The organic light emitting display device of claim 8, further comprising a polarizing plate located at an outer side of the transmittance control layer.

12. The organic light emitting display device of claim 8, wherein a thickness of the reflective layer is less than a thickness of the black matrix.

13. An organic light emitting display device, comprising:
    a substrate including first to third sub-pixels which are arranged in a direction;
    first to third light emitting diodes disposed on the substrate and respectively located in the first to third sub-pixels; and
    a transmittance control layer, light emitted from the first to third light emitting diodes being transmitted toward the transmittance control layer, the transmittance control layer including a lens-shaped transparent pattern and a gray pattern,
    wherein the gray pattern is located to cover the lens-shaped transparent pattern, and has different thicknesses according to a thickness of the lens-shaped transparent pattern, and
    wherein the transparent pattern has a shape in the direction corresponding to a green sub-pixel among the first to third sub-pixels that is different from a shape in the direction of the transparent pattern corresponding to red and blue sub-pixels among the first to third sub-pixels.

14. The organic light emitting display device of claim 13, wherein the gray pattern corresponding to the red and blue sub-pixels has a third thickness corresponding to a side surface of the transparent pattern in the direction, and
    wherein the gray pattern positioned corresponding to the green sub-pixel has a fourth thickness, greater than the third thickness, corresponding to a side surface of the transparent pattern in the direction.

15. The organic light emitting display device of claim 14, wherein the gray pattern having the fourth thickness has a transmittance of 20 to 40%.

16. The organic light emitting display device of claim 14, wherein the gray pattern having the third thickness has a transmittance of 40 to 60%.

* * * * *